United States Patent
Yoshizawa

(10) Patent No.: US 7,274,226 B2
(45) Date of Patent: Sep. 25, 2007

(54) POWER SOURCE VOLTAGE MONITORING CIRCUIT FOR SELF-MONITORING ITS POWER SOURCE VOLTAGE

(75) Inventor: Takeshi Yoshizawa, Kanagawa (JP)

(73) Assignee: NEC Electronics Corporation, Kawasaki, Kanagawa (JP)

(*) Notice: Subject to any disclaimer, the term of this patent is extended or adjusted under 35 U.S.C. 154(b) by 58 days.

(21) Appl. No.: 11/085,132

(22) Filed: Mar. 22, 2005

(65) Prior Publication Data
US 2005/0218969 A1    Oct. 6, 2005

(30) Foreign Application Priority Data
Mar. 31, 2004  (JP)  ............... 2004-106184

(51) Int. Cl.
*H03L 7/00*    (2006.01)
*H03K 5/131*    (2006.01)
(52) U.S. Cl. .................. 327/143; 327/142; 327/541
(58) Field of Classification Search ........ 327/142–143, 327/530, 77, 538–541
See application file for complete search history.

(56) References Cited

U.S. PATENT DOCUMENTS 4,712,477 A * 12/1987 Aikou et al. ............... 102/206
5,455,469 A * 10/1995 Ward ....................... 307/141.4
5,920,182 A *  7/1999 Migliavacca ............... 323/282

FOREIGN PATENT DOCUMENTS

JP       359014383 A  *  1/1984
JP       9-135157           5/1997

\* cited by examiner

*Primary Examiner*—Dinh T. Le
(74) *Attorney, Agent, or Firm*—McGinn IP Law Group PLLC

(57) ABSTRACT

A power source voltage monitoring circuit for monitoring self power source voltage comprises a reference voltage circuit which is supplied with a power source voltage, and generates and outputs a reference voltage in accordance with the power source voltage, a comparator which is supplied with an output voltage output from the reference voltage circuit and a voltage varying with the power source voltage, compares the voltages, and outputs a result of the comparison, and a control circuit which prevents the voltage in accordance with the power source voltage from being input to the comparator before the voltage output from the reference voltage circuit reaches a predetermined reference voltage.

10 Claims, 3 Drawing Sheets

CONVENTIONAL ART

POWER SOURCE VOLTAGE MONITORING CIRCUIT FOR SELF-MONITORING ITS POWER SOURCE VOLTAGE

BACKGROUND OF THE INVENTION

1. Field of the Invention

This invention relates to a power source voltage monitoring circuit having a comparator which monitors its power source voltage.

2. Description of Related Art

The configuration of the conventional power source voltage monitoring circuit is explained by referring to FIG. 5. The power source voltage monitoring circuit 200 monitors the potential of the power source, that is, the power source voltage Vcc, detects whether or not the power source voltage Vcc decreases under a predetermined value, and outputs the result of the detection. The power source voltage monitoring circuit 200 has a reference voltage circuit 1. The reference voltage circuit 1 generates a reference voltage, and supplies it to one of the input terminals of a comparator 2. The reference voltage Vcc is divided by sense resistors R1 and R2. The divided voltage is supplied to the other input terminal of the comparator 2.

When the power source voltage Vcc is increased from 0V, the changes of the voltage at nodes a, b and c in FIG. 5 are explained by referring to FIG. 6. At t0, the power source voltage Vcc starts increasing from 0V. The power source voltage Vcc increases proportionally to time. The increase of the power source voltage Vcc allows the reference voltage circuit 1 to start initiating. Then, the voltage Va, which represents the output at node a, increases proportionally to time. At t1, the power source voltage Vcc reaches the startup voltage of the reference voltage circuit 1, allowing the voltage Va to surge and then maintain itself at a constant reference voltage value.

Vb is the voltage at node b between the sense resistors R1 and R2 which divide the power source voltage Vcc. The increase of the power source voltage Vcc allows the voltage Vb to increase proportionally to time. The inclination of the voltage Vb is larger than the initial inclination of the voltage Va output from the reference voltage circuit 1.

Vc at node c is the output voltage of the comparator 2. In the initial phase, although the voltage Vb is lower than the reference voltage, the voltage Vc represents the same value as the power source voltage Vcc, because the voltage Vb is higher than the voltage Va.

Since the inclination of the output voltage Va becomes larger than the inclination of the voltage Vb after t1, the output voltage Va exceeds the voltage Vb at t2. When the voltage Va exceeds the voltage Vb, both of which are supplied to the comparator 2, the output voltage of the comparator 2, Vc, is 0V.

After t2, the output voltage Va from the reference voltage circuit 1 reaches a predetermined reference voltage and then becomes constant. The voltage Vb at node b continuously increases proportional to the increase of the power source voltage Vcc, so that the voltage Vb exceeds the voltage Va again at t3. When the voltage Vb exceeds the voltage Va, the output voltage of the comparator 2, Vc, recovers from 0V to the same voltage as Vcc.

Subsequently, the voltage Vb proportionally increases similarly to the case of Vc before t4 that is the time when the power source voltage Vcc reaches the desired voltage. In addition, the voltage Va still maintains itself at the reference voltage. After t4, the power source voltage Vcc reaches the desired voltage and becomes constant, similarly, the voltage Vb that is the voltage at node b dividing the power source voltage Vcc becomes constant. After t4, the output voltage of the comparator 2, Vc, becomes the same voltage as the power source voltage Vcc.

Assuming that the power source voltage Vcc decreases at t5, the divided voltage Vb also decreases and may decrease under the reference voltage Va. In this case, the voltage Vc, which represents the result of the comparison, becomes 0V after t6 if the voltage Vb is lower than the reference voltage Va. In this example, the voltage Vc is 0V during t6 to t7, then, the voltage Vc may start following Vcc again at t7 that is the time when the voltage Vb is higher than the voltage Va. During t6 to t7, it is a normal operation that the comparator 2 outputs 0V, accordingly, such the operation enables the power source voltage to be monitored.

In power on reset circuits (Japanese Unexamined Patent Application Publication No. H9-135157), the circuit for detecting the power source voltage is employed. This configuration of the power source voltage monitoring circuit, however, is not for detecting the decrease of the power source voltage, but for detecting that the power source voltage reaches a predetermined value and resetting the circuit.

In the conventional power source voltage monitoring circuit, during t0 to t2, the output voltage of the comparator 2, Vc, is the same voltage as the power source voltage Vcc, which is high level, while the voltage Vb is lower than the reference voltage, which causes a misoperation. The misoperation of the comparator 2 causes the misoperation of other circuits which operate depending on the output of the comparator 2.

SUMMARY OF THE INVENTION

According to one aspect of the present invention, there is provided a power source voltage monitoring circuit for monitoring self power source voltage comprising a reference voltage circuit which is supplied with a power source voltage, and generates and outputs a reference voltage in accordance with the power source voltage, a comparator which is supplied with an output voltage output from the reference voltage circuit and a voltage varying with the power source voltage, compares the voltages, and outputs a result of the comparison, and a control circuit which prevents the voltage in accordance with the power source voltage from being input to the comparator before the voltage output from the reference voltage circuit reaches a predetermined reference voltage.

According to another aspect of the present invention, there is provided a power source voltage monitoring circuit for monitoring self power source voltage comprising a reference voltage circuit which is supplied with a power source voltage, and generates and outputs a reference voltage in accordance with the power source voltage, a first switch which controls conduction between the power source and the comparator, and a second switch which is supplied with the output voltage output from the reference voltage circuit and controls the first switch in accordance with the output voltage, wherein the second switch controls the first switch so that the voltage in accordance with the power source voltage is not supplied to the comparator before the output voltage output from the reference voltage circuit reaches a predetermined reference voltage.

In the power source voltage monitoring circuit according to the present invention, before the voltage output from the reference voltage circuit reaches the predetermined value, for example, 0V is supplied to the comparator. After the voltage output from the reference voltage circuit reaches the predetermined value, the voltage in accordance with the power source voltage is supplied to the comparator, allowing the operation for comparison. Thus, the misoperation which would otherwise occur during the increase of the power source voltage is prevented.

BRIEF DESCRIPTION OF THE DRAWING

The above and other objects, advantages and features of the present invention will be more apparent from the following description taken in conjunction with the accompanying drawings, in which.

DESCRIPTION OF THE PREFERRED EMBODIMENTS

The invention will be now described herein with reference to illustrative embodiments. Those skilled in the art will recognize that many alternative embodiments can be accomplished using the teachings of the present invention and that the invention is not limited to the embodiments illustrated for explanatory purposed.

Figure 1:
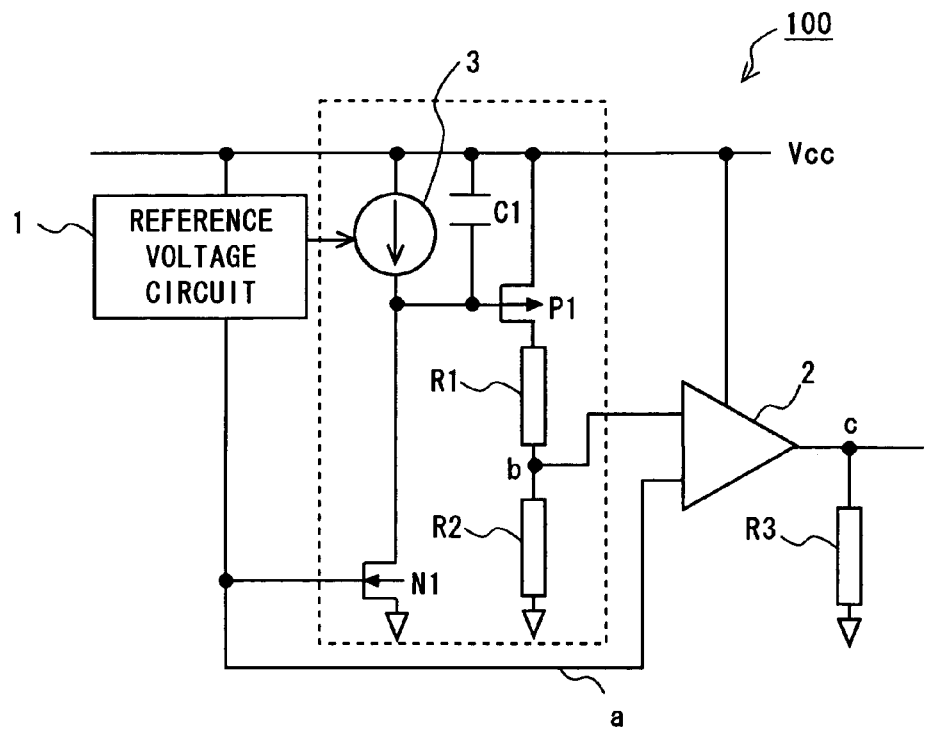
FIG. 1 shows a circuit block diagram of the power source voltage monitoring circuit according to the present invention.

The configuration of the power source voltage monitoring circuit according to the embodiment of the present invention is explained by referring to FIG. 1. The power source voltage monitoring circuit 100 monitors the potential of the power source, that is, the power source voltage Vcc, detects whether or not the power source voltage Vcc decreases under a predetermined value, and outputs the result of the detection.

The power source voltage monitoring circuit 100 has a reference voltage circuit 1. The reference voltage circuit 1 is connected to the power source voltage Vcc, and generates the reference voltage based on the power source voltage Vcc. The output terminal of the reference voltage circuit 1 is connected to one of the input terminals of the comparator 2 and supplies the reference voltage thereto. Also, the output terminal of the reference voltage circuit 1 is connected to the gate of the N-channel Metal Oxide Semiconductor (MOS) transistor N1 and supplies the reference voltage thereto.

The current source 3 and N-channel MOS transistor N1 are connected in series between the power source voltage Vcc and the ground. The current of the current source 3 is generated in the reference voltage circuit 1. Specifically, the current source 3 is arranged with, for example, a current mirror circuit in the reference voltage circuit 1. The current source 3 is connected to the gate of the P-channel MOS transistor P1 and the drain of the N-channel MOS transistor N1. Such the current source 3 can ensure the switching operation of the P-channel MOS transistor P1.

In addition, the P-channel MOS transistor P1 and sense resistors R1 and R2 are connected in series between the power source voltage Vcc and the ground. The source of the P-channel MOS transistor P1 is connected to the power source voltage Vcc, and the drain is connected to the sense resistor R1. The gate of the P-channel MOS transistor P1 is connected to the power source voltage Vcc via the capacitor C1. This prevents the gate of the P-channel MOS transistor P1 from floating. The gate of the P-channel MOS transistor P1 is connected to the output terminal of the current source 3 and the drain of the N-channel transistor N1. The source of the N-channel transistor N1 is grounded.

The connection node b of the sense resistors R1 and R2 is connected to the other input terminal of the comparator 2. Then, the voltage divided by the sense resistors R1 and R2 is supplied to the other input terminal of the comparator 2.

The comparator 2 is connected to the power source voltage Vcc, and its output terminal is connected to the pull-down resistor R3 and pulled down thereby.

Figure 2:
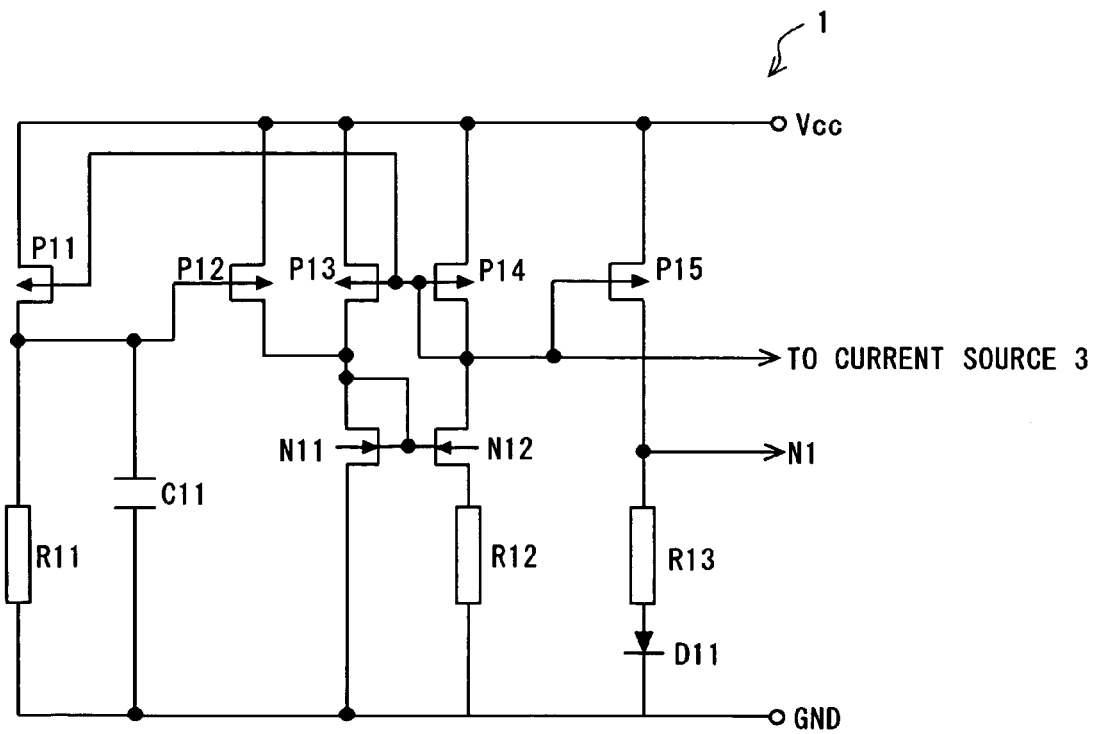
FIG. 2 is a circuit diagram showing one example of the reference voltage circuit of the power source voltage monitoring circuit according to the present invention.

Here, an example of the configuration of the reference voltage circuit 1 is explained by referring to FIG. 2. As shown in FIG. 2, a series circuit, in which the P-channel MOS transistor P13 and the N-channel MOS transistor N11 are connected in series, is inserted between the power source voltage Vcc and the ground GND. Further, another series circuit, in which the P-channel MOS transistor P14, the N-channel MOS transistor N12 and the resistor R12 are connected in series, is inserted.

The gate of the P-channel MOS transistor P13 and the gate and drain of the P-channel MOS transistor P14 are connected together. The gate and the drain of the N-channel MOS transistor N11 and the gate of the N-channel MOS transistor N12 are connected. The connection node of the gates of the P-channel MOS transistors P13 and P14 and the drain of the P-channel MOS transistor P14 is connected to the current source 3 and the gate of the P-channel MOS transistor P15. The P-channel MOS transistor P15, the resistor R13, and the diode D11 which has the anode connected to the resistor R13 are connected in series and inserted between the power source voltage Vcc and the ground GND. The voltage of the connection node of the P-channel MOS transistor P15 and register R13 is supplied to the N-channel MOS transistor N1 shown in FIG. 1.

In addition, the P-channel MOS transistors P12 and P13 are connected in parallel, the gate of the transistor P12 is connected the drain of the P-channel MOS transistor P11. The P-channel MOS transistor P11 and the resistor R11 are connected in series and inserted between the power source voltage Vcc and the ground GND. The drain of the P-channel MOS transistor P11 is grounded via the capacitor C11.

The reference voltage circuit 1 generates the reference voltage employing such the configuration above.

Figure 3:
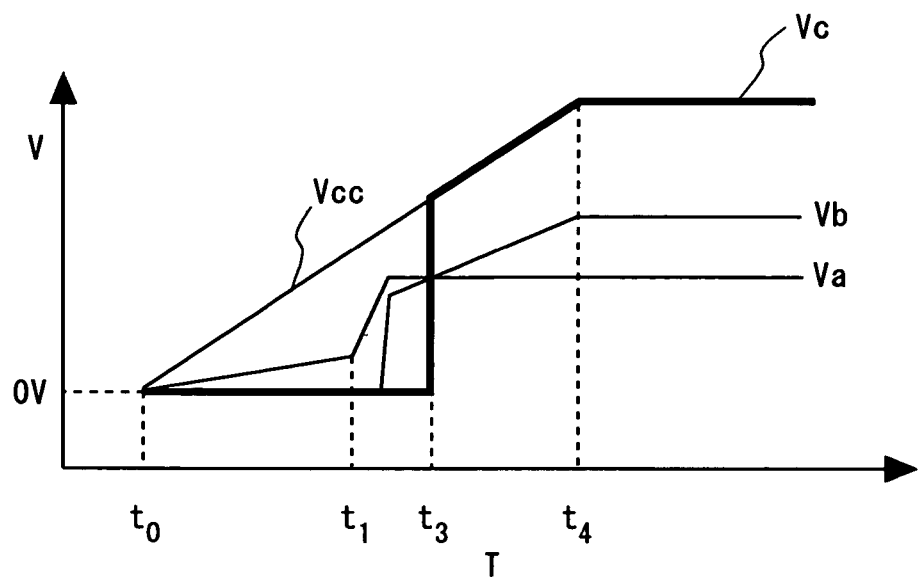
FIG. 3 shows waveforms showing the voltages at respective nodes of the power source voltage monitoring circuit according to the present invention.

Next, when the power source voltage Vcc is increased from 0V, the changes of the voltage at nodes a, b and c of FIG. 1 are explained by referring to FIG. 3. At t0, the power source voltage Vcc starts increasing from 0V. The power source voltage Vcc increases proportionally to time.

Following the increase of the power source voltage Vcc, the reference voltage circuit 1 starts up, and then, the voltage Va, which represents the output at node a, increases proportionally to time. At t1, the power source voltage Vcc reaches the startup voltage of the reference voltage circuit 1, allowing the voltage Va to surge and then maintain itself at a constant reference voltage value.

Here, the N-channel transistor N1 is in OFF state before the voltage Va output from the reference voltage circuit 1 reaches a predetermined reference voltage. Thus, the gate of the P-channel transistor P1, which is connected to the drain of the N-channel transistor N1, is supplied with current from the current source 3, allowing the gate voltage to be in high level, so that the P-channel transistor P1 is in OFF state. Thus, the power source voltage Vcc and node b are open, so that the other input voltage of the comparator 2 is 0V.

When the voltage Va increases and reaches the predetermined reference voltage, the N-channel transistor N1 turns on. Upon the N-channel transistor N1 turning on, the gate voltage of the P-channel transistor P1 decreases and the transistor P1 turns on. Then, the power source voltage Vcc is divided by the sense resistors R1 and R2 through the P-channel transistor P1. At t3, the divided voltage Vb exceeds the reference voltage Va, allowing the voltage Vc output from the comparator 2 to become equal to the power source voltage Vcc.

Then, at t4, when the power source voltage Vcc reaches the desired voltage and become constant, the output voltage of the comparator 2, Vc, also becomes constant. After that, the operation is the same as in the conventional circuit, thus, its explanation is omitted.

In this manner, in the power source voltage monitoring circuit 100, in accordance with the embodiment of the present invention, before the voltage output from the reference voltage circuit 1 reaches the predetermined value, 0V is supplied to the comparator 2. After the voltage output from the reference voltage circuit 1 reaches the predetermined value, the voltage in accordance with the power source voltage Vcc is supplied to the comparator 2, allowing the operation for comparison. Thus, the misoperation which would otherwise occur during the increase of the power source voltage is prevented.

Figure 4:
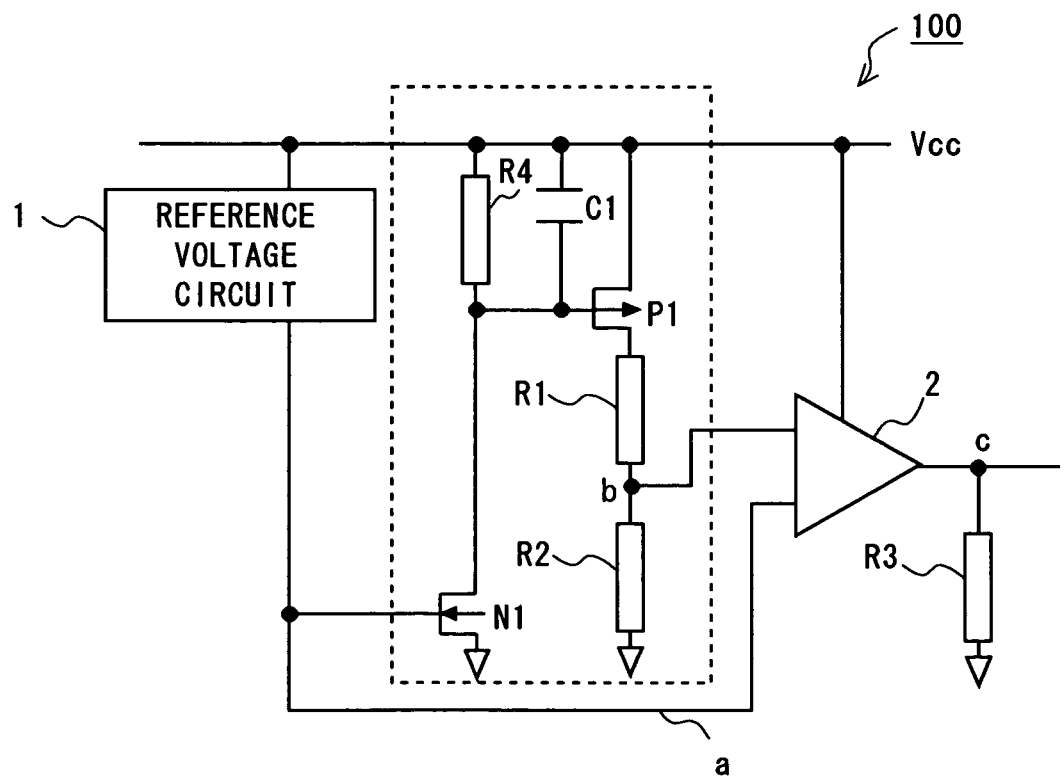
FIG. 4 shows another circuit block diagram of the power source voltage monitoring circuit according to the present invention.
Figure 5:
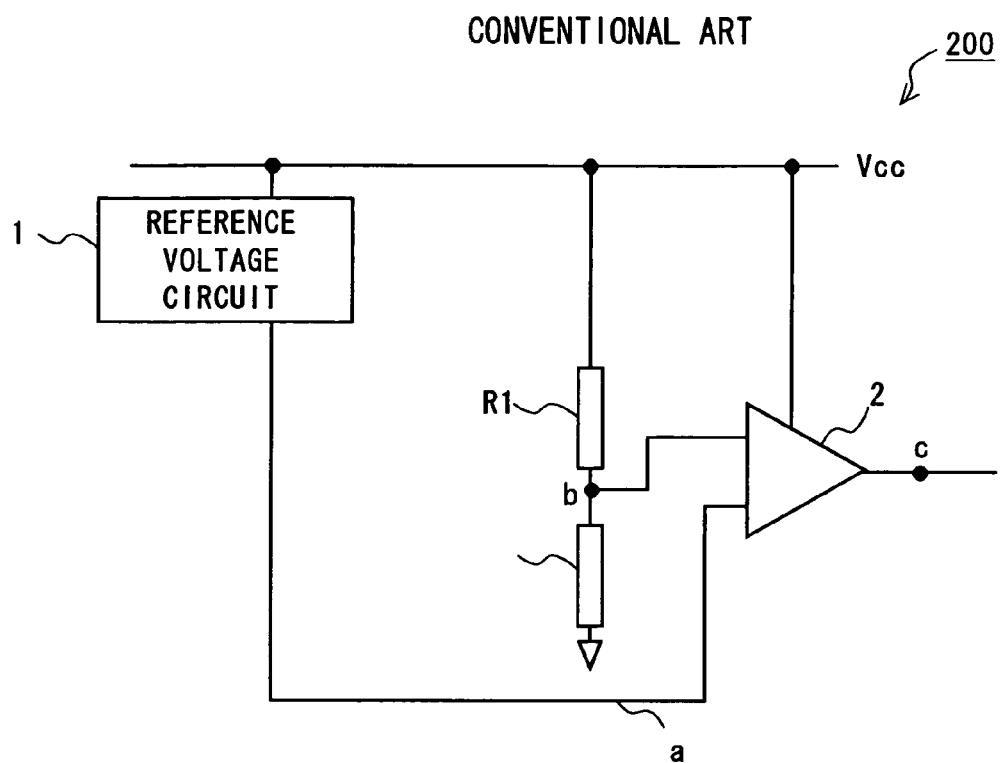
FIG. 5 shows a conventional circuit block diagram of the power source voltage monitoring circuit.
Figure 6:
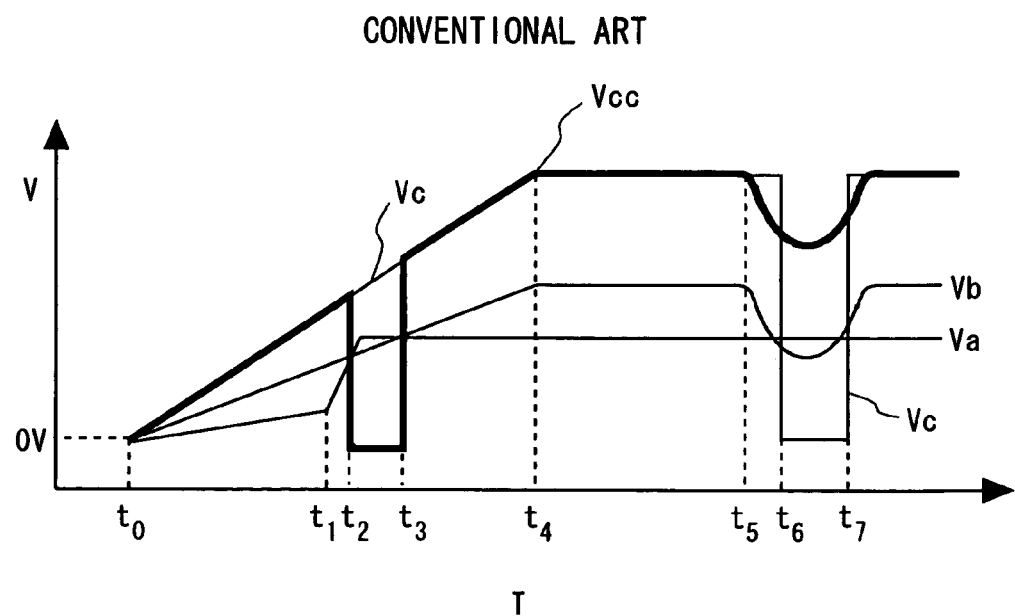
FIG. 6 shows waveforms showing the voltages at respective nodes of the conventional power source voltage monitoring circuit.

While the current source 3 is employed in the embodiment of FIG. 1, the current source 3 can be substituted by the resistor R4 as shown in FIG. 4. It is preferable that the resistor R4 is of high resistance in view of reducing the increase of power consumption.

In addition, while the capacitor C1 is connected in the embodiments in FIGS. 1 and 4, the capacitor C1 is not necessarily required. The capacitor C1 can be removed if there is no possibility of the floating gate of the P-channel transistor P1 during t0 to t1 as is the case of the circuit shown in FIG. 4.

It is apparent that the present invention is not limited to the above embodiment and it may be modified and changed without departing from the scope and spirit of the invention.

What is claimed is:

1. A power source voltage monitoring circuit for monitoring self power source voltage, comprising:
a reference voltage circuit which is supplied with a power source voltage, generates a reference voltage from the power source voltage, and outputs the reference voltage;
a comparator which is supplied with the reference voltage and an output voltage generated from the power source voltage, compares the reference voltage and the output voltage, and outputs a result of the comparison; and
a control circuit, operatively coupled to the reference voltage circuit, which prevents the output voltage generated by the power source voltage from being input to the comparator until the reference voltage reaches a predetermined voltage.

2. A power source voltage monitoring circuit for monitoring self power source voltage, comprising:
a reference voltage circuit which is supplied with a power source voltage, and generates a reference voltage from the power source voltage, and outputs the reference voltage;
a comparator which is supplied with the reference voltage and an output voltage generated from the power source voltage, compares the reference voltages and the output voltage, and outputs a result of the comparison;
a first switch which controls conduction between the power source and the comparator; and
a second switch which is supplied with the reference voltage and controls the first switch in accordance with the output voltage of the reference voltage circuit,
wherein the second switch controls the first switch so that the output voltage is not supplied to the comparator until the reference voltage reaches a predetermined voltage.

3. A power source voltage monitoring circuit for monitoring self power source voltage comprising:
a reference voltage circuit which is supplied with a power source voltage, and generates and outputs a reference voltage in accordance with the power source voltage;
a comparator which compares a voltage input from a first input terminal and a voltage input from a second in put terminal and outputs a result of the comparison;
a first transistor which controls conduction between the power source and the comparator; and
a second transistor whose gate is supplied with the output voltage output from the reference voltage circuit and whose drain is connected to a gate of the first transistor,
wherein the first input terminal of the comparator is supplied with a voltage switched by the first transistor, and the second transistor supplies voltage to the gate of the first transistor so that the voltage in accordance with the power source voltage is not supplied to the comparator before the output voltage output from the reference Voltage circuit reaches a predetermined reference voltage.

4. The power source voltage monitoring circuit of claim 3, wherein a current from a current source originating from the reference voltage circuit is supplied to a first node between the gate of the first transistor and the drain of the second transistor.

5. The power source voltage monitoring circuit of claim 3, wherein a node between the gate of the first transistor and the drain of the second transistor is connected to a resistor which is connected to the power source.

6. The power source voltage monitoring circuit of claim 4, wherein a second node between the gate of the first transistor and the drain of the second transistor is connected to a capacitor which is connected to the power source.

7. A power source voltage monitoring circuit for monitoring self power source voltage comprising:
a reference voltage circuit which is supplied with a power source voltage, and generates and outputs a reference voltage in accordance with the power source voltage;
a comparator which compares a voltage input from a first input terminal and a voltage input from a second input terminal via the reference voltage circuit;
a P-channel MOS transistor whose drain is connected to the power source and a source is connected to the first input terminal via a dividing voltage circuit; and
an N-channel MOS transistor whose gate is supplied with the output voltage from the reference voltage circuit, drain is connected the gate of the P-channel MOS transistor, and a source is grounded, wherein the N-channel MOS transistor turns on when the voltage supplied to the gate thereof reaches a predetermined reference voltage.

8. The power source voltage monitoring circuit of claim 7, wherein a current from a current source originating from the reference voltage circuit is supplied to a first node between the gate of the P-channel MOS transistor and the drain of the N-channel MOS transistor.

9. The power source voltage monitoring circuit of claim 7, wherein a node between the gate of the P-channel MOS transistor and the drain of the N-channel MOS transistor is connected to a resistor which is connected to the power source.

10. The power source voltage monitoring circuit of claim 8, wherein a second node between the gate of the P-channel MOS transistor and the drain of the N-channel MOS transistor is connected to a capacitor which is connected to the power source.

* * * * *